US012720771B2

(12) United States Patent
Jiang et al.

(10) Patent No.: US 12,720,771 B2
(45) Date of Patent: Aug. 25, 2026

(54) 3D MEMORY CELL WITH DUAL-SIDE CONTACTS AND METHOD OF FABRICATION

(71) Applicant: Yangtze Memory Technologies Co., Ltd., Wuhan (CN)

(72) Inventors: Li Jiang, Wuhan (CN); Beibei Li, Wuhan (CN); Bin Yuan, Wuhan (CN); Zongke Xu, Wuhan (CN); Wei Xu, Wuhan (CN); Lei Xue, Wuhan (CN); Zongliang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 404 days.

(21) Appl. No.: 18/234,325

(22) Filed: Aug. 15, 2023

(65) Prior Publication Data

US 2025/0017026 A1 Jan. 9, 2025

Related U.S. Application Data

(63) Continuation of application No. PCT/CN2023/105856, filed on Jul. 5, 2023.

(51) Int. Cl.
*G11C 11/00* (2006.01)
*H10B 80/00* (2023.01)
(Continued)

(52) U.S. Cl.
CPC ............ *H10B 80/00* (2023.02); *H10W 90/00* (2026.01); *H10W 80/211* (2026.01); (Continued)

(58) Field of Classification Search
CPC ......... H10B 80/00; H01L 24/08; H01L 24/80; H01L 25/0657; H01L 25/18; H01L 25/50
See application file for complete search history.

(56) References Cited

U.S. PATENT DOCUMENTS 10,074,616 B2 * 9/2018 Standing ................ H10D 30/63
11,271,007 B2 3/2022 Xia et al.
(Continued)

FOREIGN PATENT DOCUMENTS

CN 109729742 A 5/2019
CN 114613749 A 6/2022
(Continued)

OTHER PUBLICATIONS

Written Opinion in International Appln. No. PCT/CN2023/105856, mailed on Dec. 1, 2023, 4 pages.
(Continued)

*Primary Examiner* — Pho M Luu
(74) *Attorney, Agent, or Firm* — Fish & Richardson P.C.

(57) ABSTRACT

An implementation of a memory device includes a stack structure having alternating first layers and dielectric layers. The stack structure has a first surface and a second surface opposite to the first surface. First contact structures include a conductive material. The first contact structures penetrate from the first surface into the stack structure to be in contact respectively with a first portion of first layers. Second contact structures include a conductive material. Each of the second contact structures penetrates from the second surface into the stack structure to be in contact respectively with a remainder portion of conductive layers other than the first portion of the first layers.

20 Claims, 14 Drawing Sheets

(51) Int. Cl.
*H10W 90/00* (2026.01)
*H10W 80/00* (2026.01)

(52) U.S. Cl.
CPC ........ *H10W 80/312* (2026.01); *H10W 80/327* (2026.01); *H10W 90/792* (2026.01)

(56) References Cited

U.S. PATENT DOCUMENTS

| | | | |
|---|---|---|---|
| 11,302,627 B1 | 4/2022 | Chen et al. | |
| 11,342,352 B2 | 5/2022 | Chen et al. | |
| 11,348,936 B2 | 5/2022 | Chen et al. | |
| 2018/0261611 A1* | 9/2018 | Norizuki | H01L 21/31144 |
| 2020/0098748 A1 | 3/2020 | Hong et al. | |
| 2021/0296336 A1 | 9/2021 | Xue et al. | |
| 2021/0296346 A1 | 9/2021 | Yang et al. | |
| 2022/0123012 A1 | 4/2022 | Gao et al. | |
| 2023/0005942 A1* | 1/2023 | Hwang | H10B 41/46 |

FOREIGN PATENT DOCUMENTS

| | | |
|---|---|---|
| CN | 114730770 | 7/2022 |
| CN | 115036266 A | 9/2022 |
| WO | WO 2023027786 | 3/2023 |

OTHER PUBLICATIONS

International Search Report in International Appln. No. PCT/CN2023/105856, mailed on Dec. 1, 2023, 4 pages.

Office Action in Chinese Appln. No. 202380010487.9, mailed on Apr. 30, 2026, 23 pages (with machine translation).

* cited by examiner

3D MEMORY CELL WITH DUAL-SIDE CONTACTS AND METHOD OF FABRICATION

CROSS-REFERENCE TO RELATED APPLICATIONS

This application is a continuation of International Application No. PCT/CN2023/105856 filed on Jul. 5, 2023, the disclosure of which is hereby incorporated by reference in its entirety.

TECHNICAL FIELD

The present disclosure relates to three-dimensional (3D) memory devices and fabrication methods thereof.

BACKGROUND

Planar memory cells are scaled to smaller sizes by improving process technology, circuit design, programming algorithm, and fabrication processes. However, as feature sizes of the memory cells approach a lower limit, planar process and fabrication techniques become challenging and costly. As a result, memory density for planar memory cells approaches an upper limit. A 3D memory architecture can address the density limitation in planar memory cells. The 3D memory architecture includes a memory array and peripheral devices for controlling signals to and from the memory array.

SUMMARY

This disclosure describes three-dimensional (3D) memory devices and methods of fabrication. For example, in one aspect, a method includes providing a stack structure including alternating first layers and dielectric layers, wherein the stack structure has a first surface and a second surface opposite to the first surface. The method includes forming first contact structures penetrating from the first surface into the stack structure to be in contact respectively with a first portion of the first layers. Additionally, the method includes forming second contact structures penetrating from the second surface into the stack structure to be in contact respectively with a remainder portion of the first layers other than the first portion of the first layers.

In another aspect, the present disclosure describes a memory device includes a stack structure having alternating first layers and dielectric layers. The stack structure has a first surface and a second surface opposite to the first surface. The memory device includes first contact structures having a conductive material. The first contact structures penetrate from the first surface into the stack structure to be in contact respectively with a first portion of first layers. The memory device also includes second contact structures have a conductive material, wherein each of the second contact structures penetrates from the second surface into the stack structure to be in contact respectively with a remainder portion of conductive layers other than the first portion of the first layers.

In another aspect, the present disclosure also describes a system that includes a memory device configured to store data. The memory device includes a stack structure has alternating first layers and dielectric layers. The stack structure has a first surface and a second surface opposite to the first surface. The memory devices includes first contact structures that have a conductive material. Each of the first contact structures penetrates from the first surface into the stack structure to be in contact respectively with a first portion of first layers. Second contact structures of the memory device have a conductive material. Each of the second contact structures penetrates from the second surface into the stack structure to be in contact respectively with a remainder portion of conductive layers other than the first portion of the first layers. A memory controller electrically connects to and controls the memory device.

The details of one or more implementations of the subject matter of this specification are set forth in the accompanying drawings and the description below. Other features, aspects, and advantages of the subject matter will become apparent from the description, the drawings, and the claims.

Some implementations provide one or more of the following advantages. For example, in some implementations, forming contact structures extending through top and bottom surfaces increase an overall density of a 3D memory device, as both of the first surface and second surface have contact structures extending through 3D memory device towards a center of the 3D memory device. The higher density 3D memory devices increase storage capacity for a given vertical space, such that greater memory capacity can be achieved without increasing vertical space.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

The accompanying drawings, which are incorporated herein and form a part of the specification, illustrate aspects of the present disclosure and, together with the description, further explain the principles of the present disclosure and enable a person of ordinary skill in the pertinent art to make and use the present disclosure.

The present disclosure will be described with reference to the accompanying drawings. Like reference numbers and designations in the various drawings indicate like elements.

DETAILED DESCRIPTION

Figure 1:
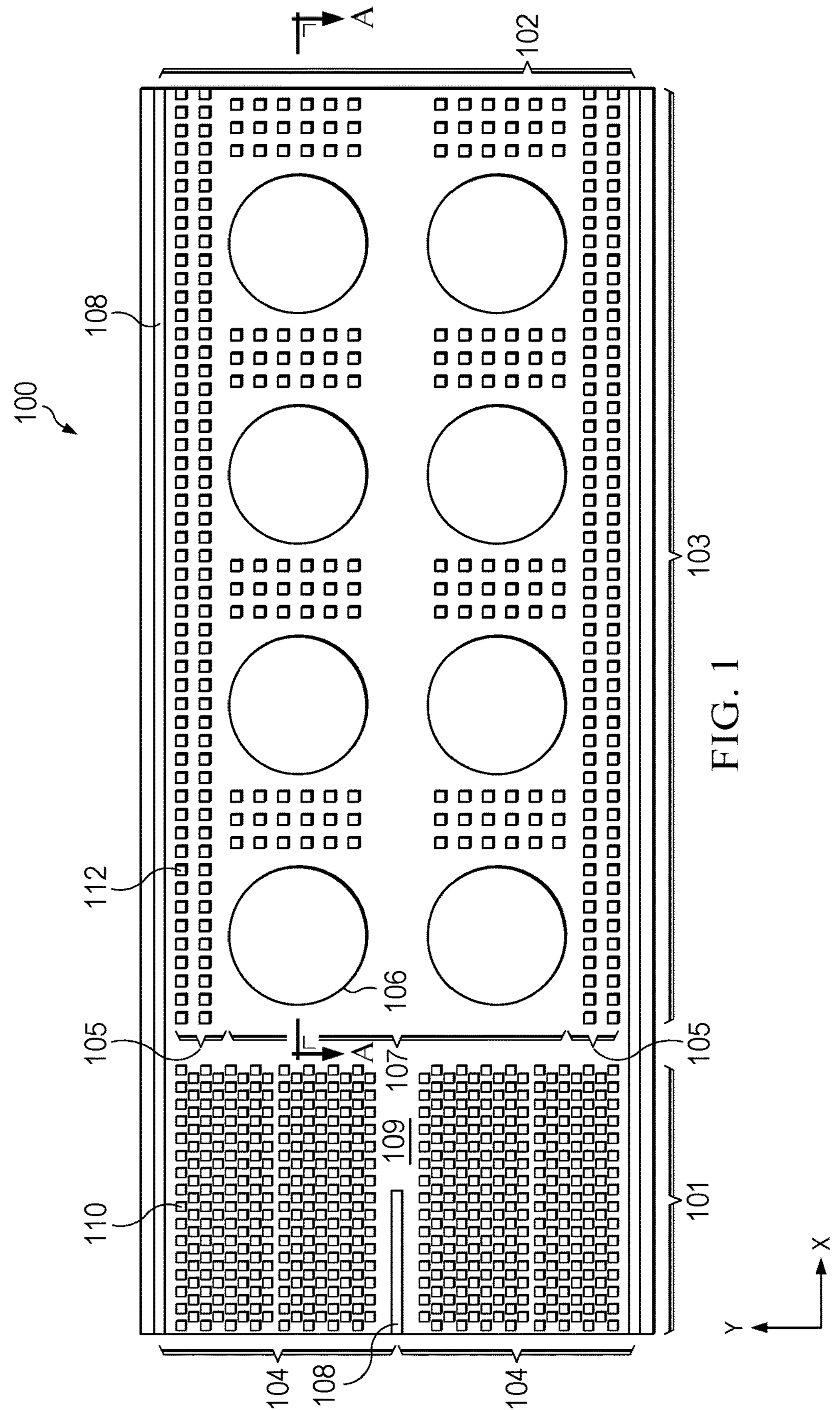
FIG. 1 illustrates a plan view of a 3D memory device having contact structures, according to some aspects of the present disclosure.

Although specific configurations and arrangements are discussed, it should be understood that this is done for illustrative purposes only. As such, other configurations and arrangements can be used without departing from the scope of the present disclosure. The present disclosure can also be employed in a variety of other applications. Functional and structural features as described in the present disclosure can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Furthermore, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Furthermore, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors (in which interconnect lines and/or vertical contacts are formed) and one or more dielectric layers.

In some 3D memory devices, such as 3D NAND memory devices, memory cells for storing data are vertically stacked through a stack structure (e.g., a memory stack) in vertical channel structures. 3D memory devices usually include contact areas formed on one or more sides (edges), or at the center, of the stacked storage structure for purposes such as word line pick-up/fan-out using electrical/physical contacts landed onto different steps/levels of a contact area. Dummy channel structures are sometimes formed through the memory stack in areas outside of the core array area in which the channel structures of 3D NAND memory devices are formed, to provide mechanical support to the stack structure, in particular, during the gate replacement process that temporarily removes some layers of the stack structure through slit openings across the core array area and contact areas of the stack structure.

The integration of the various structures, such as dummy channel structures, contact structures, contact areas, slit openings, etc., from both the device design perspective and the fabrication process perspective, has become more and more challenging as the memory cell density of the 3D NAND memory devices continues to increase.

To address one or more of the aforementioned issues, implementations described herein are directed to forming contact structures on both sides of a stack structure. A channel length of the contact structure need also be at a substantially same length in order to reach the conductive layers (e.g., word lines) in the 3D memory device. There may be, for example, 400 or more channels in the 3D memory device. Each channel may require a specific aspect ratio, critical dimension (CD), and spacing between the channels of the contact structures. For example, the CD of a channel penetrating through less than 300 layers can be between 1 mm and 2 mm.

A combination of isotropic and anisotropic etching can be used to form the channels, so that the correct depth of the vertical channel is reached and a correct horizontal length is achieved for each conductive layer of the stack structure. At a depth of more than, e.g., 300 layers, into the stack structure, etch precision and selectivity are reduced. To address this challenge, the method disclosed herein forms a multiple contact structures on a first side of the stack structure, flips the stack structure, and proceeds by forming a second plurality of contact structures on a second side of the stack structure. Advantageously, the disclosed method enables, in some cases, more narrow 3D memory structures. And an overall density of the 3D memory structures can be increased because both the first surface and second surface of the stack structure have contact structures extending therethrough. Accordingly, more 3D memory structures can be horizontally arranged in a controller, thus enabling a denser array of 3D memory structures.

FIG. 1 illustrates a plan view of a 3D memory device 100 having contact structures 106, according to some aspects of the present disclosure. In some implementations, the 3D memory device 100 is a NAND Flash memory device in which memory cells are provided in the form of an array of NAND memory strings. It is noted that x and y axes are included in FIG. 1 to illustrate two orthogonal (perpendicular) directions in the wafer plane. The x-direction is the stack layer (e.g., word line) direction of 3D memory device 100, and the y-direction is the bit line direction of 3D memory device 100.

As shown in FIG. 1, 3D memory device 100 can include one or more blocks 102 arranged in the y-direction (the bit line direction) separated by slit structures 108, such as gate line slits (GLSs). In some implementations in which 3D memory device 100 is a NAND Flash memory device, each block 102 is the smallest erasable unit of the NAND Flash memory device. Each block 102 can further include multiple fingers 104 in the y-direction separated by slit structures 108 with "H" cuts 109.

As shown in FIG. 1, 3D memory device 100 can be divided into at least a core array area 101 (aka, core area) in which an array of channel structures 110 are formed, as well as a contact area 103 in which contact structures 106 are formed. Core array area 101 and contact area 103 are arranged in the x-direction (the stack layer direction), according to some implementations. Although one core array area 101 and one contact area 103 are illustrated in FIG. 1, multiple core array areas 101 and/or multiple contact areas 103 may be included in 3D memory device 100, for example, one contact area 103 between two core array areas 101 in the x-direction, in other examples. FIG. 1 only illustrates portions of core array area 101 that are adjacent to contact area 103.

As described below in detail, contact area 103 can include conductive portions 105 and dielectric portions 107 arranged in the y-direction. As shown in FIG. 1, contact structures 106 are disposed in dielectric portion 107, while dummy channel structures 112 are disposed in conductive portion 105 of contact area 103 to provide mechanical support and/or load balancing, according to some implementations. In some implementations (e.g., as shown in FIG. 1), dummy channel structures 112 are disposed in dielectric portion 107 of contact area 103 as well, for example, between contact structures 106 in the x-direction. In some implementations, dummy channel structures 112 are not disposed in dielectric portion 107 of contact area 103, i.e., only in conductive portion 105 of contact area 103. As shown in FIG. 1, each finger 104 of 3D memory device 100 can include one row of contact structures 106 disposed in dielectric portion 107 of contact area 103. The layout and arrangement of contact structures 106, as well as the shape of each contact structure 106, may vary in different examples.

Figure 2:
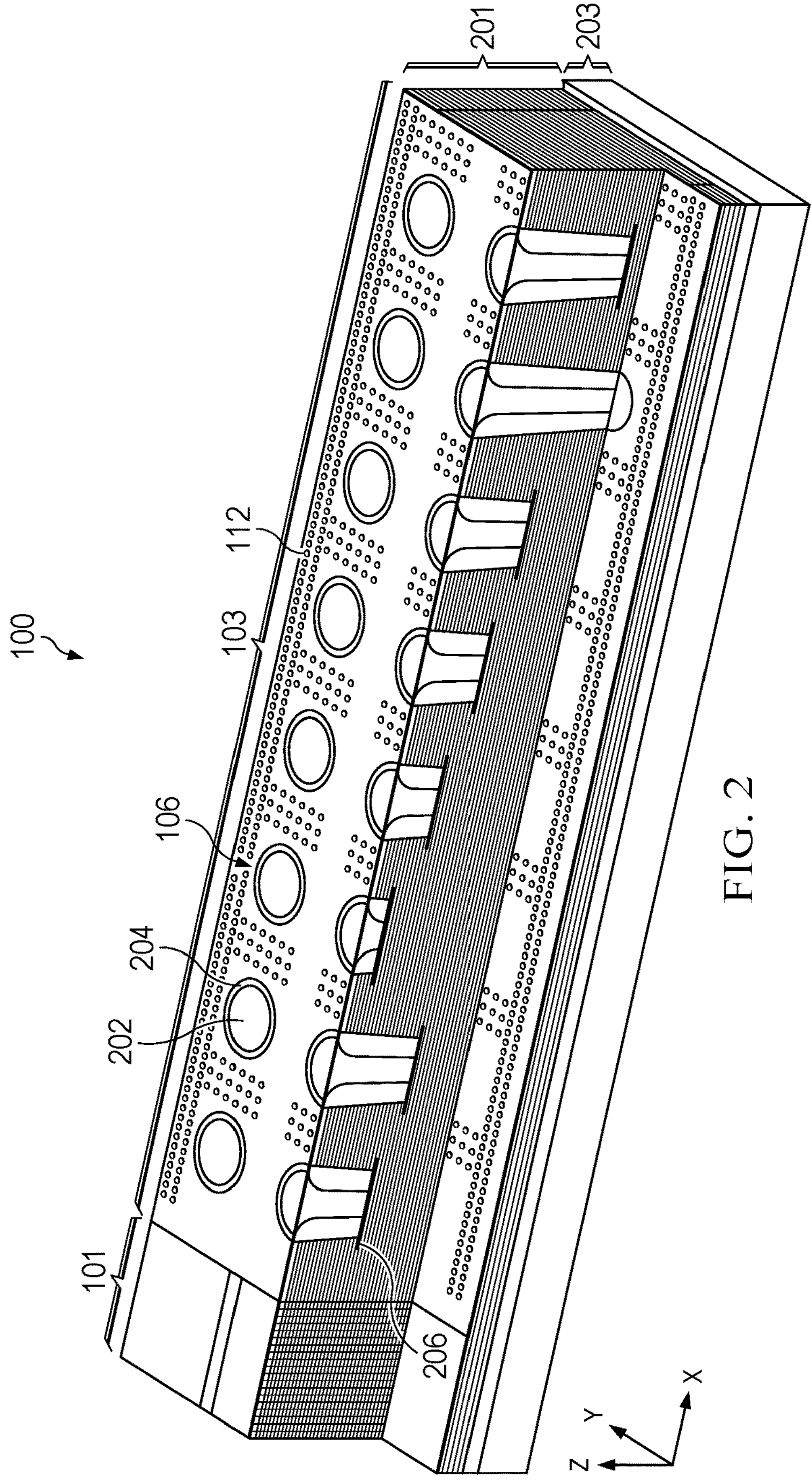
FIG. 2 illustrates a top perspective view of a 3D memory device having contact structures, according to some aspects of the present disclosure.

FIG. 2 illustrates a top perspective view of 3D memory device 100 having contact structures 106, according to some aspects of the present disclosure. As shown in FIGS. 1 and 2, a stack structure 201 can be formed on a substrate 203, which can include silicon (e.g., single crystalline silicon), silicon germanium (SiGe), gallium arsenide (GaAs), germanium (Ge), silicon on insulator (SOI), or any other suitable materials. In some implementations, substrate 203 includes single crystalline silicon, which is part of the wafer on which 3D memory device 100 is fabricated, either in its native thickness or after being thinned. In some implementations, substrate 203 includes, for example, polysilicon, which is a semiconductor layer replacing the part of wafer on which 3D memory device 100 is fabricated. It is noted that x, y, and z axes are included in FIGS. 1 and 2 to further illustrate the spatial relationship of the components in 3D memory device 100. Substrate 203 of 3D memory device 100 includes two lateral surfaces extending laterally in the x-y plane: a top surface on the front side of the wafer on which stack structure 201 can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of 3D memory device 100 is determined relative to substrate 203 of 3D memory device 100 in the z-direction (the vertical direction perpendicular to the x-y plane) when substrate 203 is positioned in the lowest plane of 3D memory device 100 in the z-direction. The same notion for describing the spatial relationship is applied throughout the present disclosure.

Figure 3:
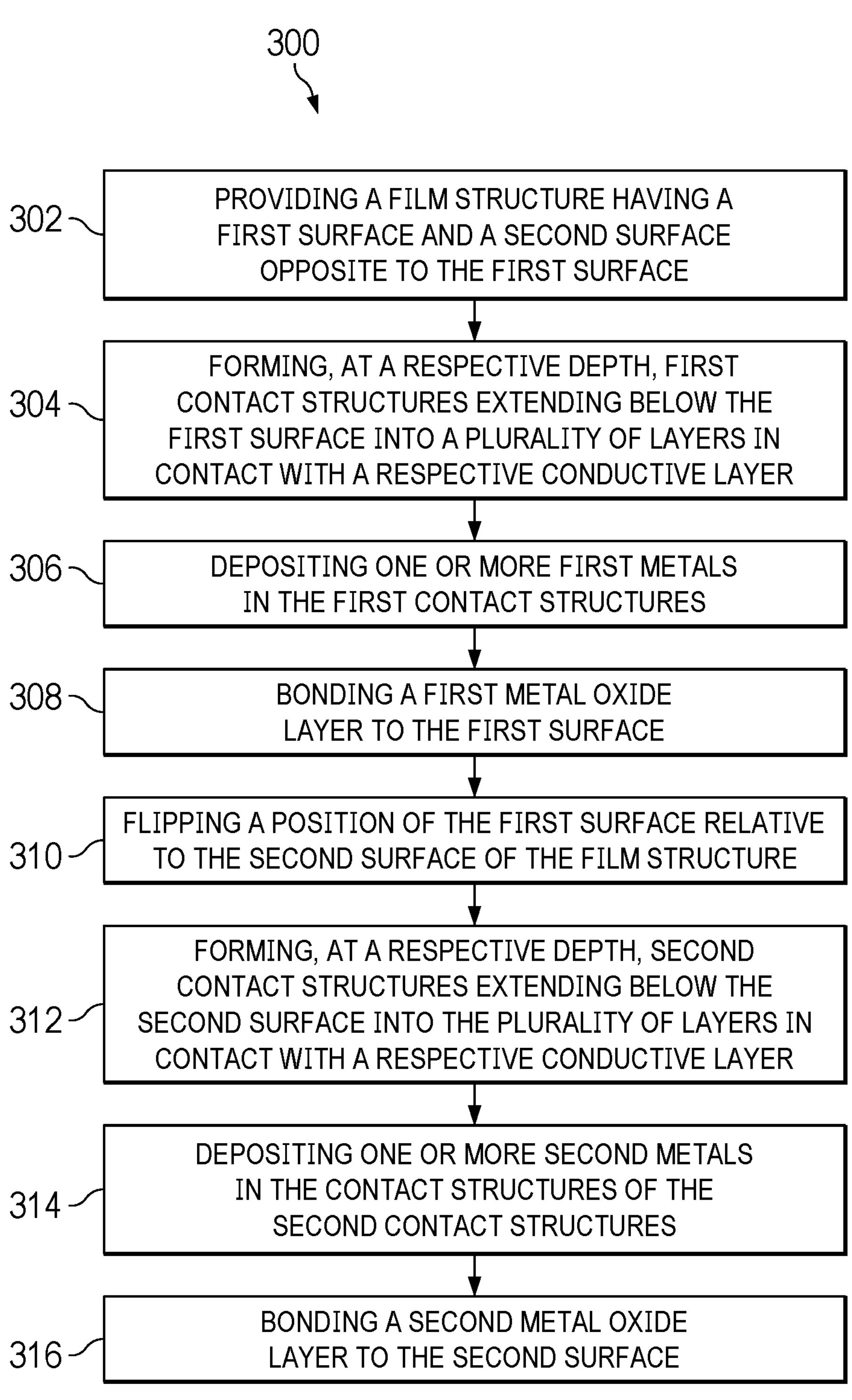
FIG. 3 shows a flow chart of a method of forming the 3D memory device shown in FIGS. 1 and 2.
Figure 4:
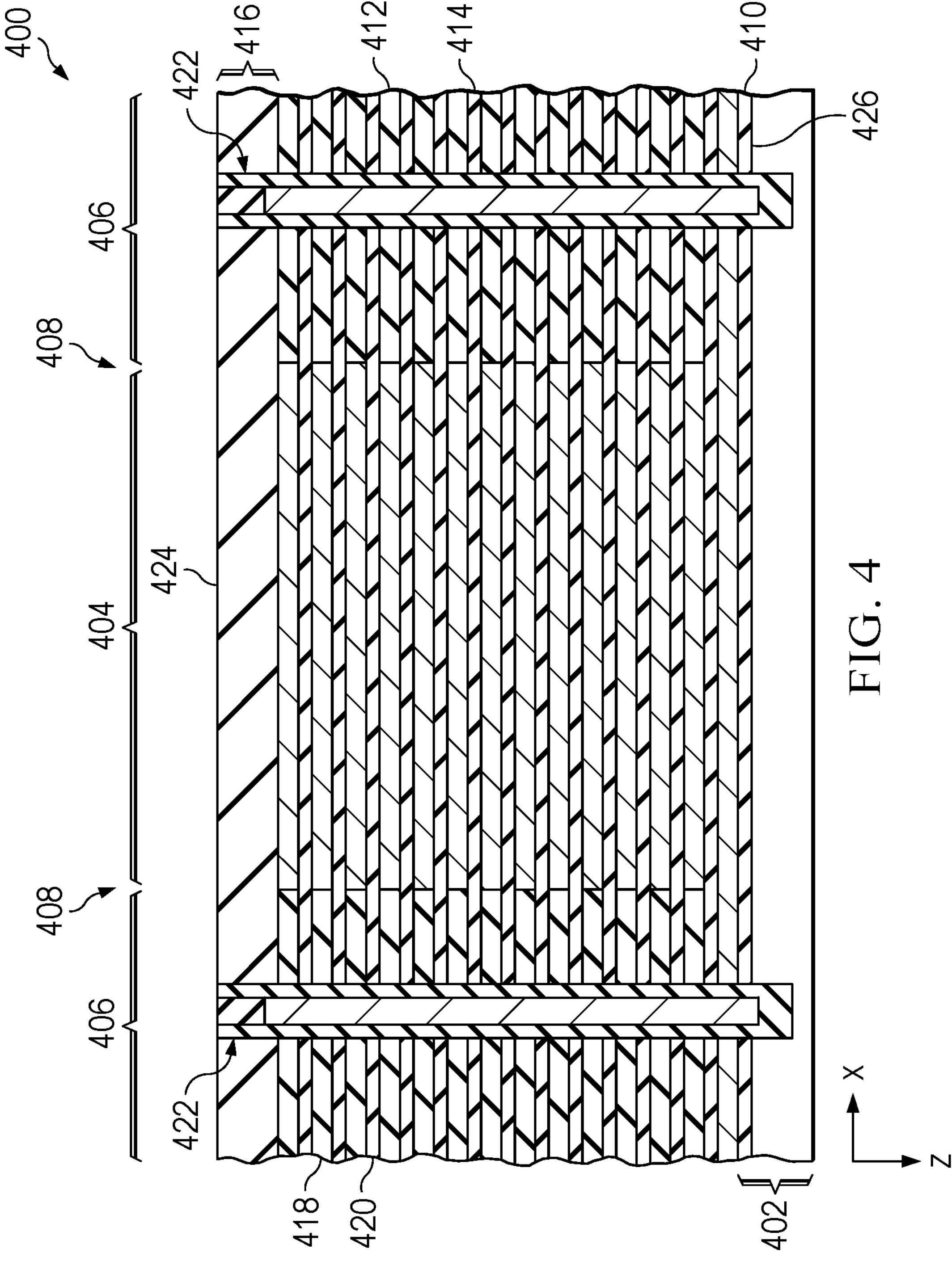
FIG. 4 illustrates a side view of a stack structure 400 having interleaved layers.

FIG. 3 depicts a flowchart of one example method of fabricating the stack structure shown in FIG. 1. The method 300 begins at operation 302, where a 3D stack structure 400 is provided, as shown in FIG. 4. FIG. 4 illustrates a side view of a stack structure 400 having plural interleaved layers. The 3D stack structure 400 includes a contact area 404 and a core area 406 that converge at an interface 408. The 3D stack structure 400 is disposed over a first substrate 402 having a first insulating layer 410 arranged therebetween. The 3D stack structure 400 has a first surface 424 and a second surface 426, opposite the first surface 424. The 3D stack structure 400 is disposed between the first surface 424 and the second surface 426.

The contact area 404 includes a first dielectric layer 412 and second dielectric layer 414 that are interleaved through the stack structure 400. One or more of second insulating layers 416 are disposed over a topmost first dielectric layer 412. The first dielectric layer 412 and second dielectric layer 414 can include one or more dielectric materials. For example, the first dielectric layer 412 can include an oxide, such as silicon oxide. The second dielectric layer 414 can include a nitride, such as SiN or TiN. The insulating layer 416 can be an oxide layer or a layer having other type(s) of dielectric material(s).

The core area 406 includes a first conductive layer 418 interleaved with the first dielectric layer 412. A high-k dielectric layer 420 circumscribes the first conductive layer 418. The high-k dielectric layer 420 and the first dielectric layer 412 contact one another at the interface 408. Because, in some examples, a length of first dielectric layer 412 and first conductive layer 418 can differ in each vertical row of the 3D stack structure 400, a horizontal position of the interface 408 will depend on a given row of the stack structure 400.

Each of the first substrate 402, the first insulating layer 410, first dielectric layer 412, second dielectric layer 414, second insulating layer 416, first conductive layer 418, and the high-k dielectric layer 420 have a first surface parallel to the first surface 424 and a second surface parallel to the second surface 426 of the 3D stack structure 400. In one example, the high-k dielectric layer 420 is made of an oxide material. In some examples, the high-k dielectric layer 420 is composed of any one of or a combination of aluminum oxide ($Al_2O_3$), hafnium oxide ($HfO_2$), tantalum oxide ($Ta_2O_5$). The first conductive layer 418 can be composed of tungsten (W) or cobalt (Co), in some implementations. Herein, high-k refers to a material having high dielectric constant, K.

A conductive channel structure 422 is formed in the core area 406 of the 3D stack structure 400. The conductive channel structure 422 extends through the first dielectric layers 412 and the second dielectric layers 414 in the contact area 404. Dummy channels (not shown) mechanically support the 3D stack structure 400 during fabrication. The conductive channel structure 422 can have a cylinder shape (e.g., a pillar shape), in at least one example. However, other shapes are feasible without departing from the scope of this disclosure.

To form the conductive channel structure 422, a channel hole extending vertically through the stack structure is formed. In some implementations, a memory layer and a channel layer are sequentially formed over sidewalls of the channel hole. A memory layer (including a blocking layer, a storage layer, and a tunneling layer) and a channel layer are sequentially formed in this order along sidewalls and the bottom surface of the hole. In some implementations, the memory layer is first deposited along the sidewalls and bottom surface of the channel hole, and the semiconductor channel is then deposited over the memory layer. The blocking layer, storage layer, and tunneling layer can be subsequently deposited in this order using one or more thin film deposition processes, to form the memory layer. The channel layer can then be formed by depositing a semiconductor material, such as polysilicon, over the tunneling layer of the memory layer using one or more thin film deposition processes.

FIG. 4 shows one example of the fabrication processes for forming the hole of the conductive channel structure 422 include wet etching and/or dry etching, such as deep-ion reactive etching (DRIE). The film layers, such as the first and second dielectric layers 412, 414, and the first and second insulating layers 410, 416 can be formed by one or more film deposition processes that include atomic layer deposition (ALD), chemical vapor deposition (CVD), physical vapor deposition (PVD), any other suitable processes, or any combination thereof. In addition, conductive layers, such as the first conductive layer 418 and the conductive channel structure 422, can be deposited using one or more thin film deposition processes, such as ALD, CVD, PVD, any other suitable processes, or any combination thereof.

The first insulating layer 410 extends horizontally between the 3D stack structure 400 and the first substrate 402. In some examples, the first insulating layer 410 surrounds the conductive channel structure 422, such that a first terminal end of the conductive channel structure 422 is exposed through a top of the second insulating layer 416. A second terminal end of the conductive channel structure 422, opposite the first terminal end, extends into the first substrate 402, beneath a top surface of the first substrate 402. The first and second insulating layers 410, 416 can be made, for example, of $SiO_2$ and have a thickness from 5 nm to 50 nm.

At operation 304, a first contact structure 500 is formed in the 3D memory device. The first contact structure 500 is formed through the first insulating. As illustrated in FIGS. 5A-5E, the stack structure having the first contact structure 500 through the plural interleaved layers. The first contact structure 500 extends through the first insulating layer 410 and a portion of the 3D stack structure 400. The first contact structure 500 is formed substantially isotopically, such that a sidewall of the first contact structure 500 is relatively symmetric about an imaginary center 516 extending through a center of the contact structure 500.

Figure 5A:
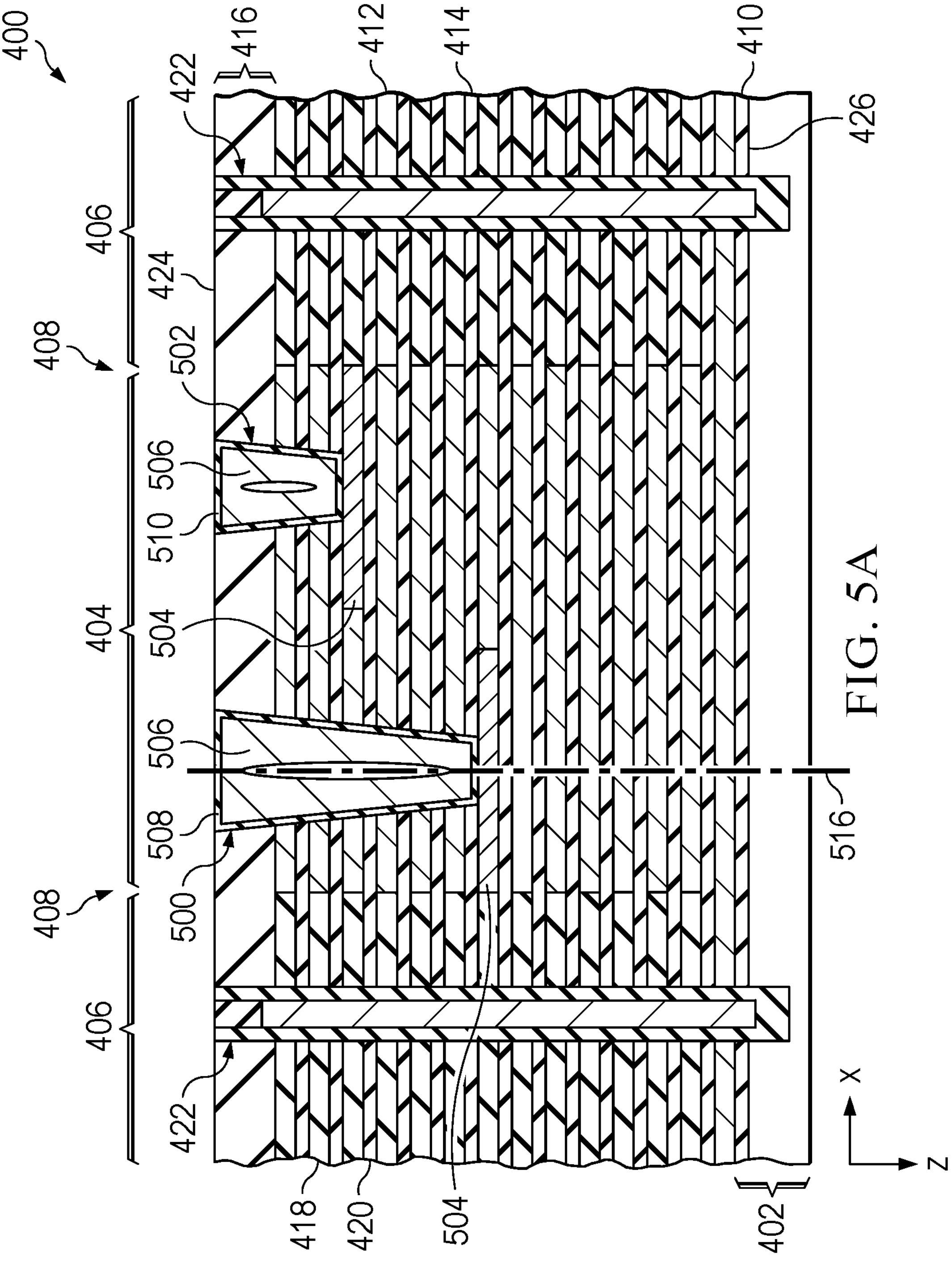
FIGS. 5A-8 illustrates the stack structure 400 at various stages of processing during the method 300 illustrated in FIG. 3.

After forming the first contact structure 500 in-whole or in-part, a horizontal channel (not shown) is formed in the 3D stack structure 400 at a terminal end of the contact structure 500. In one example, the horizontal channel is substantially symmetric about the imaginary center 516, as shown in FIG. 5A. A length in a vertical direction and height in a vertical direction are therefore substantially symmetric about the center of the vertical channel. The horizontal channel, formed symmetrically, is formed by dry etching, such as by DRIE. Accordingly, a height of the horizontal channel may decrease in a direction away from the center.

The first dielectric layer 412 is removed by etching along a length of the horizontal channel. After removing the first dielectric layer 412, the high-k dielectric layer 420 is removed from a portion of the first conductive layer 418 at the interface 408. Accordingly, the first conductive layer 418 proximate the interface 408 is exposed to an ambient environment within the 3D stack structure 400. In some examples, the length of the horizontal channel extends laterally into the contact area 404 and the core area 406.

The high-k dielectric layer 420 is removed from the first conductive layer 418 in a portion of the core area 406, such that the horizontal channel extends to the first insulating layer 410 surrounding the conductive channel structure 422. Upon removal of the high-k dielectric layer 420, the first conductive layer 418 is thus exposed to the ambient. The height of the horizontal channel is substantially uniform in a direction proceeding away from or towards the center.

In this example, a wet etchant is used to form the horizontal channel. A dry etchant is used to form the contact structure 500. Phosphoric acid is one example of a wet etchant, however other wet etchants are suitable, so long as the height of the resultant horizontal channel is substantially uniform. Advantageously, the wet etchant removes the first dielectric layer 412, and does not etch the second dielectric layer 414 (orange, dark, and light yellow). Additionally, the high-k dielectric layer 420 is etched during operation 304. In one example, phosphoric acid is the wet etchant.

Figure 5B:
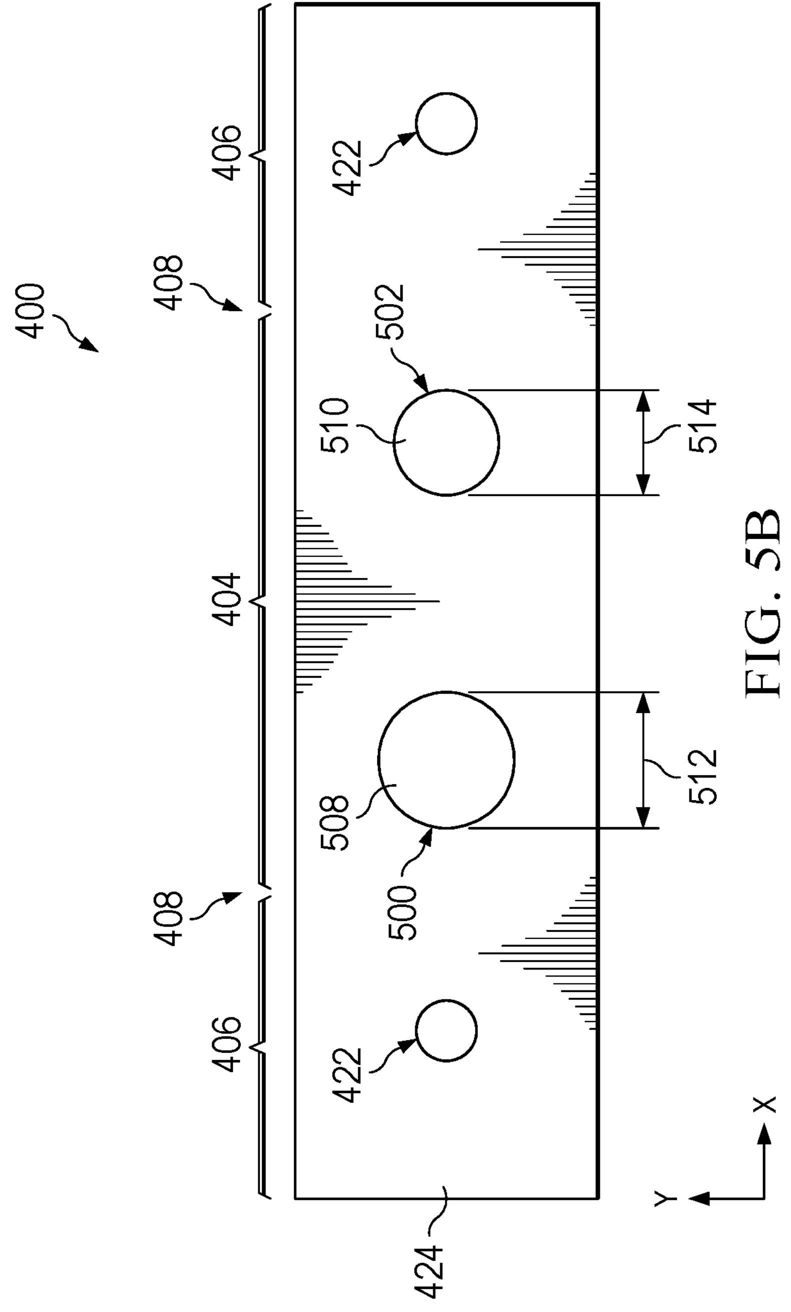

Proceeding to operation 306, one or more metals are formed in the first contact structures. FIGS. 5A and 5B illustrate first contact structure 500 and 502 extending through the 3D stack structure 400. As shown in in FIG. 5A, one or more conductive layers, such as a second conductive layer 504 (i.e., a lateral contact) and a conductive shell 508 (i.e., a first portion), are deposited in the first contact structure 500 and horizontal channel. A dielectric filler 506 is enclosed within the conductive shell 508. The dielectric filler 506 also provides structural support for the conductive shell 508 and for the surrounding layers (i.e., the first dielectric layer 412, second dielectric layer 414, and the insulating layer 416) in the contact area 404 of the 3D stack structure 400.

The second conductive layer 504 is disposed in the horizontal channel. The second conductive layer 504 overlays and is in contact with the sidewalls of the first contact structure 500, such that the second conductive layer 504 disposed in the first contact structure 500 is in contact with and electrically coupled to the first conductive layer 418. The dielectric filler 506 is formed over the second conductive layer 504. The conductive shell 508 has a flat surface 510 that is parallel to the first surface 424. In one example, a perimeter of the conductive shell 508 has a circular shape, and may form a toroid around the dielectric filler 506. Accordingly, the flat surface 510 of the conductive shell 508 has a corresponding circular shape, forming a circle or oval. In another example, the conductive shell 508 has a rectangular shape, as such, and the flat surface 510 has a corresponding rectangular shape, such as a square or rectangle.

The conductive shell 508 is deposited over the second conductive layer 504, creating a signal path between the first conductive layer 418, the second conductive layers 504, and the conductive shell 508. One advantage of this implementation is increased integrity of the conductive layers extending from the write line leading out of the 3D stack structure 400. The height of the horizontal channel, and thus a height of the first conductive layer 418 (e.g., word line), can have a thickness, for example, in a range from 10 nm to 100 nm.

The second conductive layer 504, surrounded by the high-k dielectric layer 420, fills an entirety of the horizontal channel between the contact area 404 and the core area 406. As such, the second conductive layer 504 is physically and electrically coupled to the first conductive layer 418. On an opposite side of the 3D stack structure 400 is the interface 408 in the contact area 404, the second conductive layer 504 is in contact with and terminates at a vertical sidewall of the first dielectric layer 412. An upper side and lower side (illustrated, but not numbered) of the second conductive layer 504 in the horizontal channel are in contact with the first dielectric layer 412. In this manner, the second conductive layer 504 is insulated on an upper and lower side of the second conductive layer 504. In some implementations, the second conductive layer 504 is composed of tungsten, cobalt, or a combination of both.

FIG. 5B shows a top perspective view of the 3D stack structure 400. The first contact structures 500, 502, and conductive channel structure 422 are exposed through the first surface 424 of the 3D stack structure 400. A diameter 512 of the first contact structure 500 is greater than a diameter 514 of the first contact structure 502. The diameter 512 of the first contact structure 500 and first contact structure 502 correspond to the depth of each conductive structure (e.g., word line) within the 3D stack structure 400. Accordingly, because the first contact structure 500 extends to a greater depth beneath the first surface 424 than the first contact structure 502, the diameter 512 is greater than the diameter 514. In some examples, a depth of the first contact structure 500 may be equal to or less than 300 interleaved layers (e.g., first dielectric layers 412 and second dielectric layers 414, first conductive layer 418, and high-k dielectric layer 420).

Figure 5C:
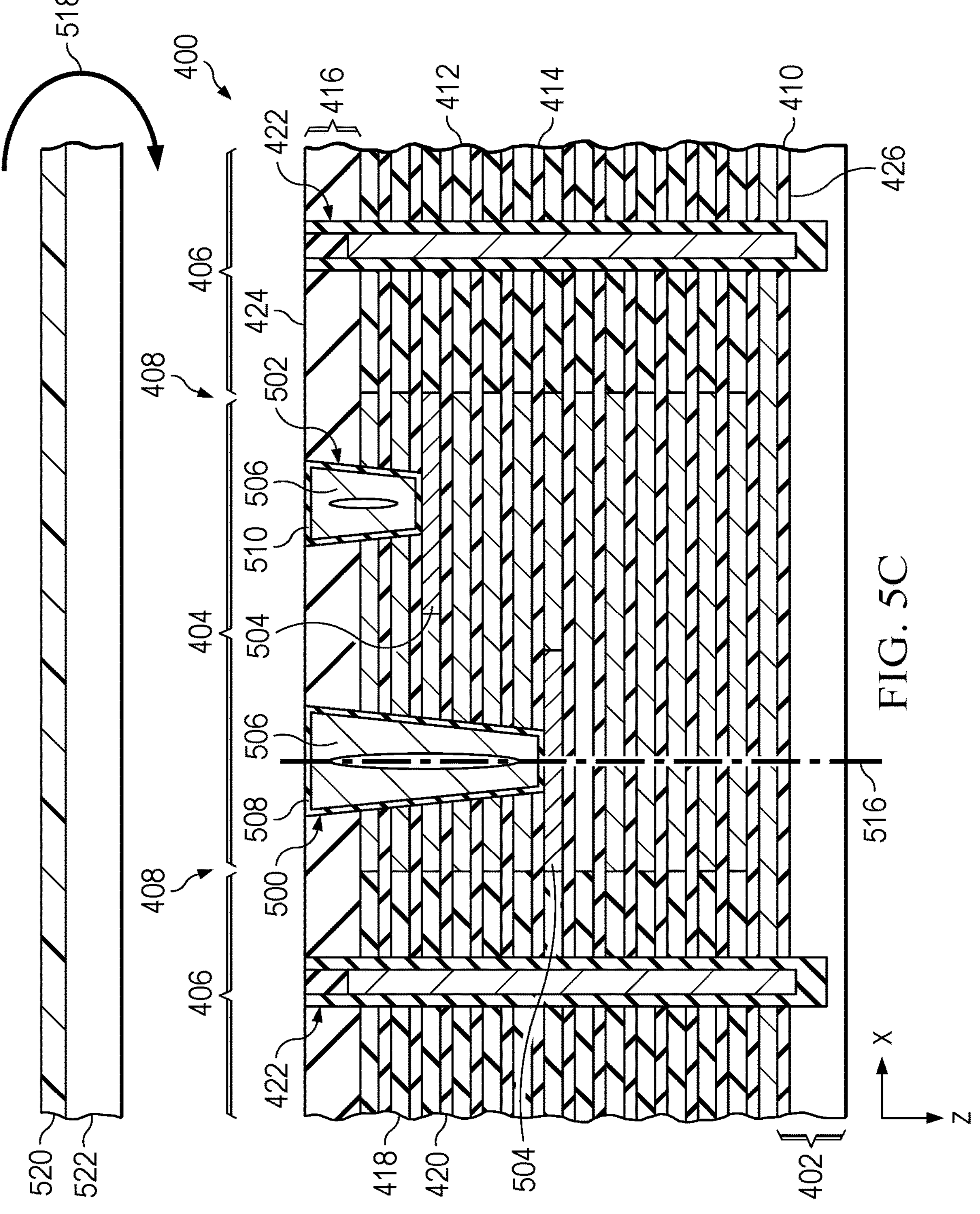

As shown in FIG. 5C, a first semiconductor layer 520 is disposed on top of and in contact with a second substrate 522 with respect to first surface 424 of the 3D stack structure 400. The first semiconductor layer 520 and second substrate 522 are rotated 518 (i.e., flipped) 180 degrees, so that the first semiconductor layer 520 faces down towards the first surface 424. In some implementations, the 3D stack structure 400 can be a part of a non-monolithic 3D memory device, in which components, such as the first semiconductor layer 520 and the stack structure 400 are formed separately on different substrates and then bonded in a face-to-face manner. In other implementations, the 3D stack structure 400 is rotated 518 by 180 degrees to reorient the first surface 424 of the 3D stack structure with the first semiconductor layer 520 for hybrid bonding.

Figure 5D:
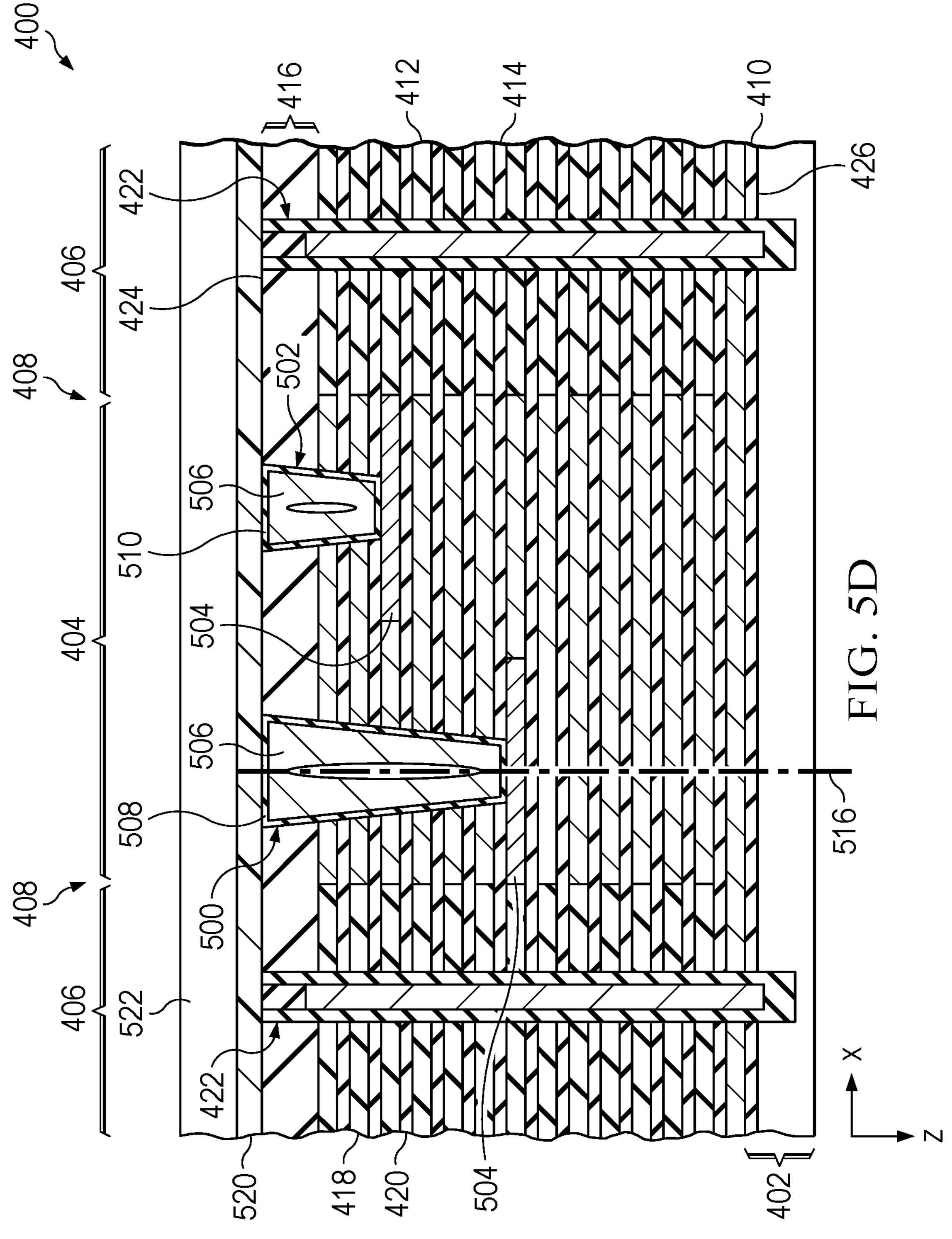

At operation 308, as illustrated in FIG. 5D, a first semiconductor layer 520 is bonded with a stack structure 400 (i.e., memory cell array) to form additional framework of the 3D stack structure 400. For example, the first semiconductor layer 520 is hybrid bonded to the first surface 424 of the 3D stack structure 400. The first semiconductor layer 520 has a first surface 604 and a second surface 606, opposite the first surface 604. One or more interconnect structures can be formed, which provide electrical signals between the stack structure 400 and one or more peripheral devices. The first semiconductor layer 520 includes a substrate, a peripheral circuit layer disposed on the substrate, and an interconnect layer disposed on the contact layer. Other structures such as through silicon vias (TSVs) electrically couple the first semiconductor layer 520 to the stack structure 400. Serial etching and deposition may be required to form interconnects and TSVs (not shown). In one example, the first semiconductor layer 520 is a complementary metal-oxide-semiconductor (CMOS).

Peripheral devices can be formed on the substrate of the first semiconductor layer 520. For example, an entirety or portion of the peripheral device is formed below a surface of substrate, and/or directly on the surface of the substrate. One or more peripheral devices can include transistors and doped regions to form source/drain regions of the transistors formed on the substrate of the first semiconductor layer 520. Some examples of peripheral devices include any suitable digital, analog, and/or mixed-signal peripheral circuits used for facilitating the operation of the 3D stack structure 400. Additionally, peripheral devices can include one or more of a power bus and metal routing, a page buffer, a decoder (e.g., a row decoder and a column decoder), a sense amplifier, a driver, a charge pump, a current or voltage reference, or any active or passive components of the circuits (e.g., transistors, diodes, resistors, or capacitors).

Figure 5E:
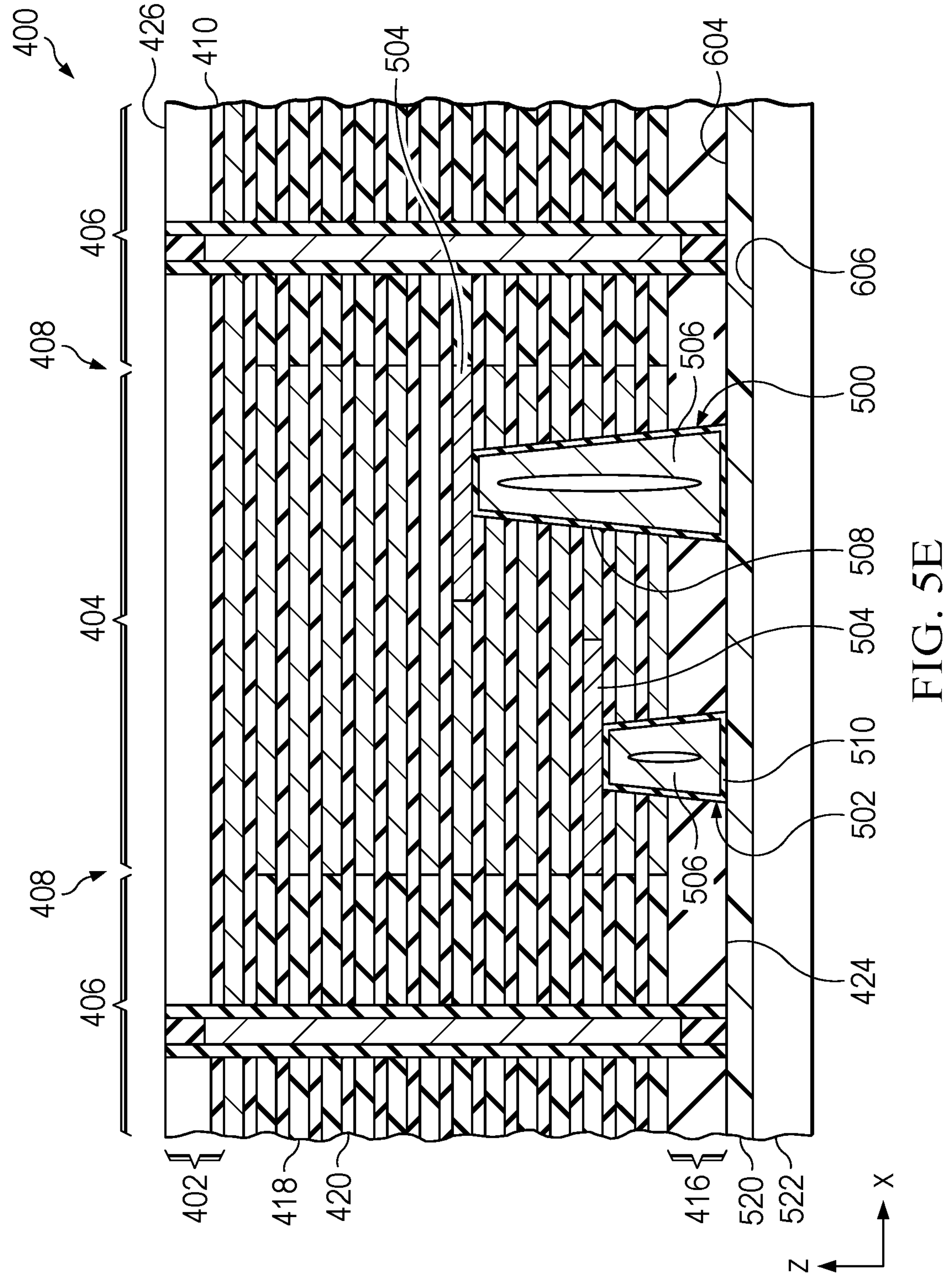

At operation 310, a position of the first surface can be flipped 180 degrees relative to the second surface of the film structure. FIG. 5E illustrates the 3D stack structure 400 flipped so that the first surface 424 and the second surface 426 have an orientation that is opposite to the orientation shown in FIGS. 5A-5D. The insulating layer 416 and 3D stack structure 400 are etched through the first surface 424 to form channels into which the first contact structures 500, 502 are formed. The first substrate 402 is removed by etching so that the first surface 424 is exposed to the ambient processing environment. In one example, the first substrate 402 is removed by using an acid.

Figure 6:
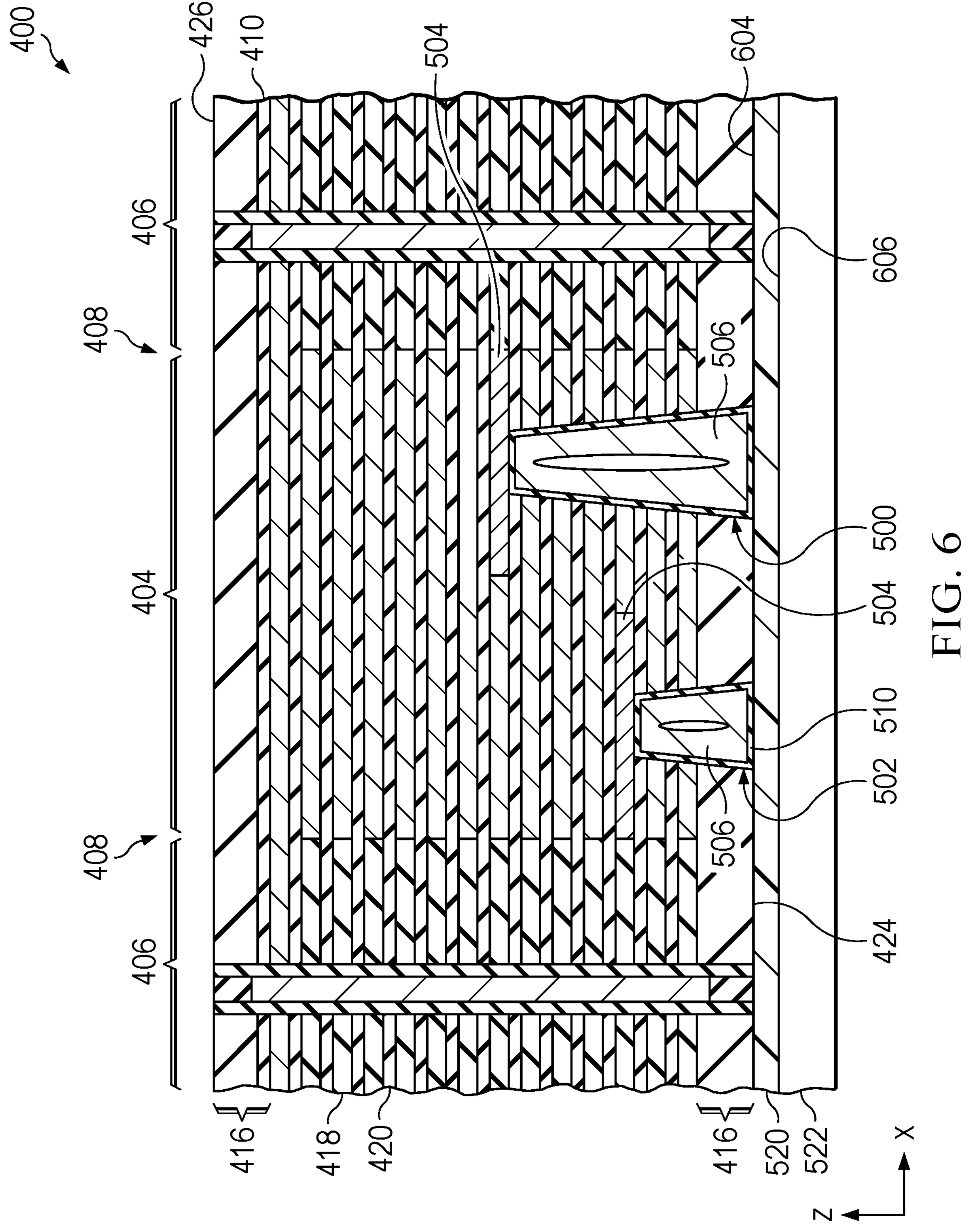

Continuing with FIG. 6, after the 3D stack structure 400 is rotated at operation 310, the first substrate 402 is removed from the 3D stack structure 400. An additional protective layer is formed, e.g., by oxide deposition, on top of and in contact with the second surface 426. In some implementations, the protective layer can be composed of a material having the same composition as the insulating layer 416, and can be formed on top of the first insulating layer 410.

Figure 7A:
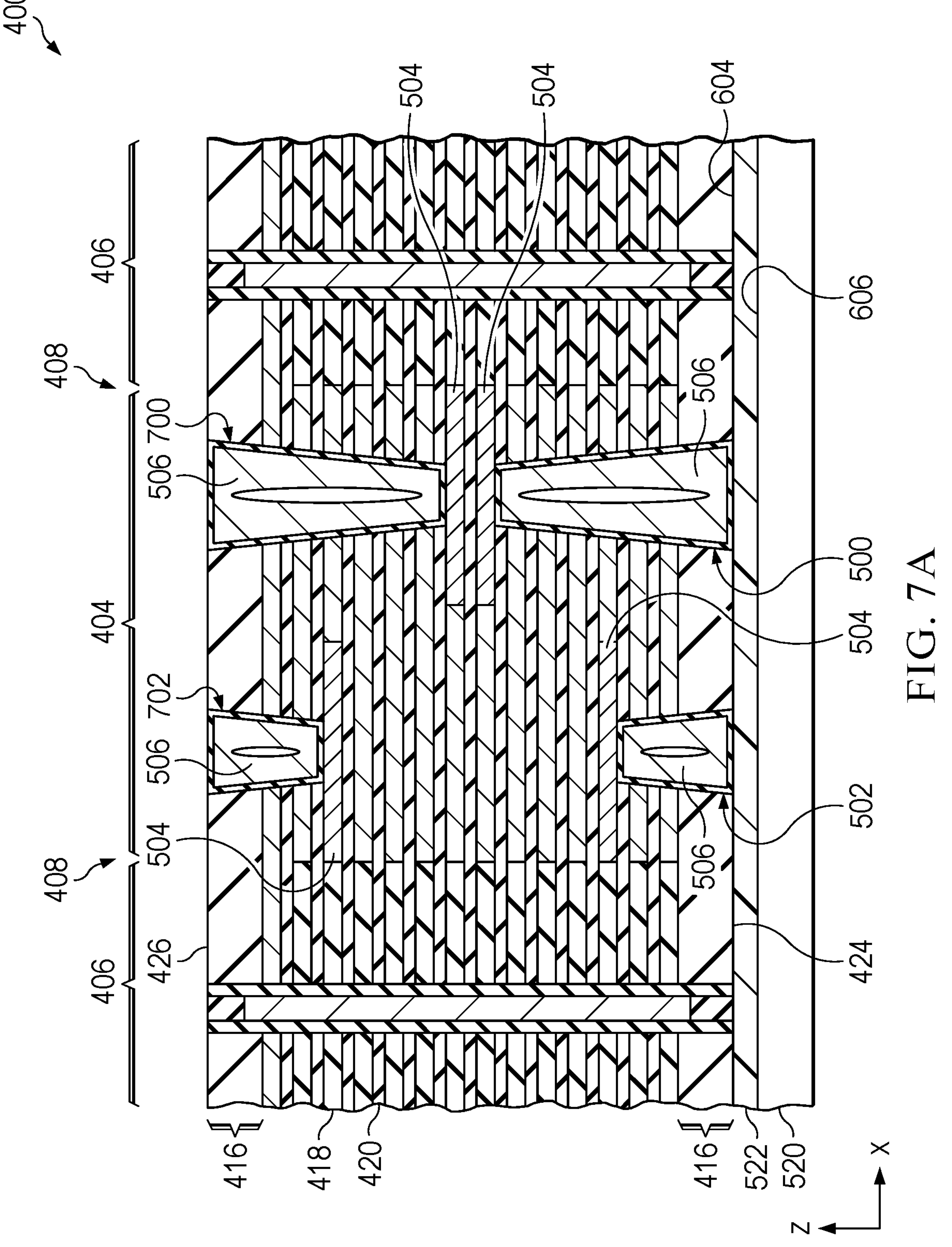

At operation 312, a second contact structure is formed on the second surface of the stack structure. As shown in FIG. 7A, second contact structures 700 and 702 are formed through the second surface 426. The second insulating layer 416 and stack structure 400 are etched through to the second surface 426 to form channels into which the second contact structures 700, 702 are formed. Vertical and horizontal channels in the second contact structures 700, 702 are formed in similar processes to vertical and horizontal channels formed in the first contact structures 500, 502, as described above with respect to operations 304-306. Accordingly, operation 312 is not repeated in an entirety.

The 3D stack structure 400 has first contact structures 500, 502 that penetrate from the first surface 424 into the stack structure 400 to be in contact respectively with a first portion of the first dielectric layers 412. The stack structure 400 has a remainder portion of layers (i.e., plural first dielectric layers 412) that are not in contact with either first contact structures 500, 502 that penetrate the first surface 424. However, the second contact structures 700, 702 are in contact with the remainder portion of the first dielectric layers 412. As such, the second contact structures 700, 702 penetrate from the second surface 426 into the 3D stack structure 400 and thereby contact respectively with a remainder portion of the first dielectric layers 412.

Figure 7B:
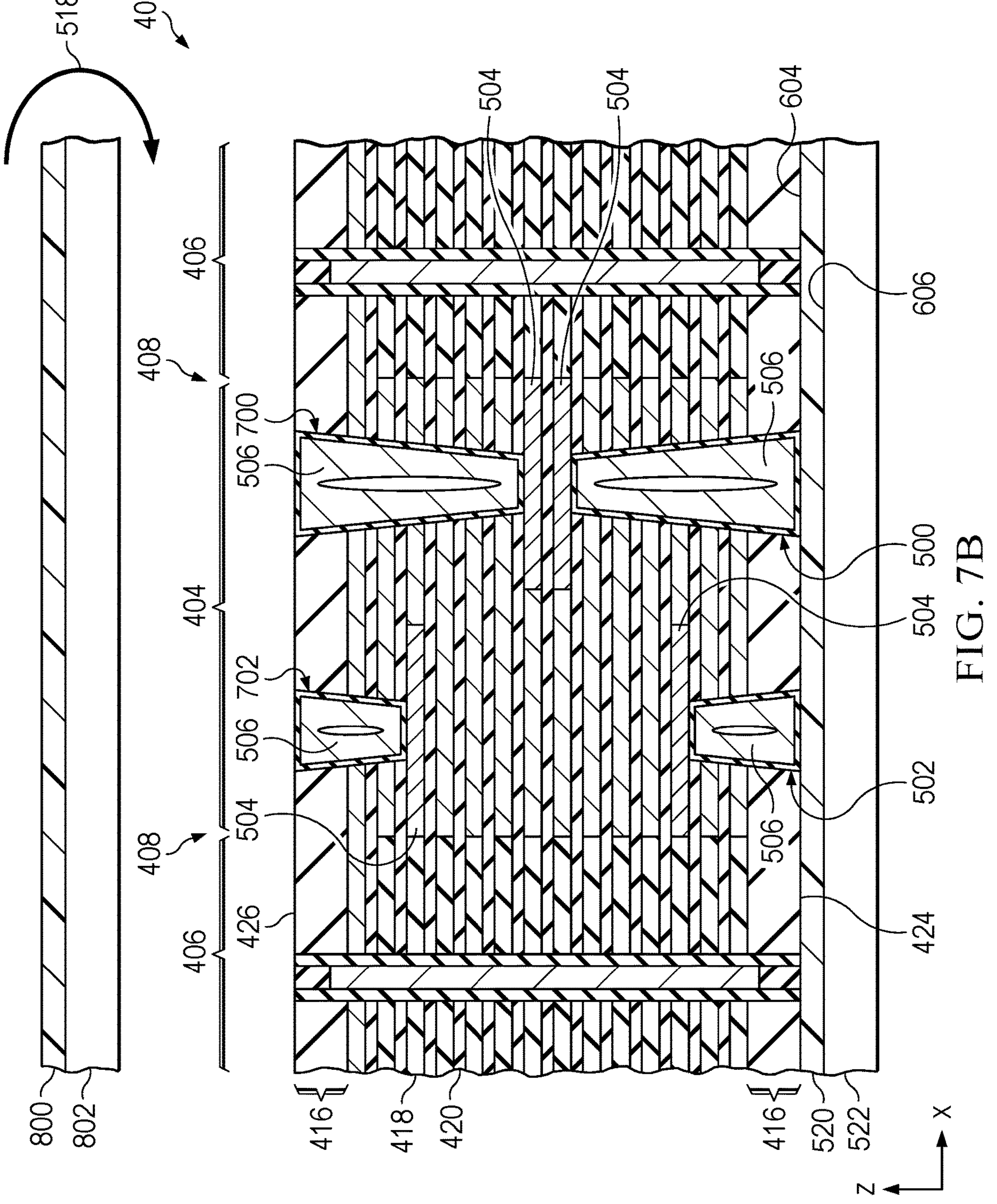

A second semiconductor layer 800 is disposed on top of and in contact with a third substrate 802 with respect to second surface 426, as illustrated in FIG. 7B. The first second semiconductor layer 800 and third substrate 802 are rotated 518 by 180 degrees with respect to the second surface 426, so that the second semiconductor layer 800 faces down towards the second surface 426. As described above with respect to the first semiconductor layer 520, in some implementations, the second semiconductor layer 800 and third substrate 802 are formed separately on different substrates and then bonded in a face-to-face manner. In other implementations, the 3D stack structure 400 is rotated 518 by 180 degrees to reorient the first surface 426 of the 3D stack structure 400 with the second semiconductor layer 800. The second semiconductor layer 800 is a CMOS, in some implementations.

At operation 314, one or more second metals are deposited in the second contact structures. Operation 314 includes similar processes as operation 306, and therefore operation 314 is not repeated in an entirety. Accordingly, the second conductive layer 504 and dielectric filler 506 are deposited in their respective channels in a similar manner as described in operation 306.

Figure 8:
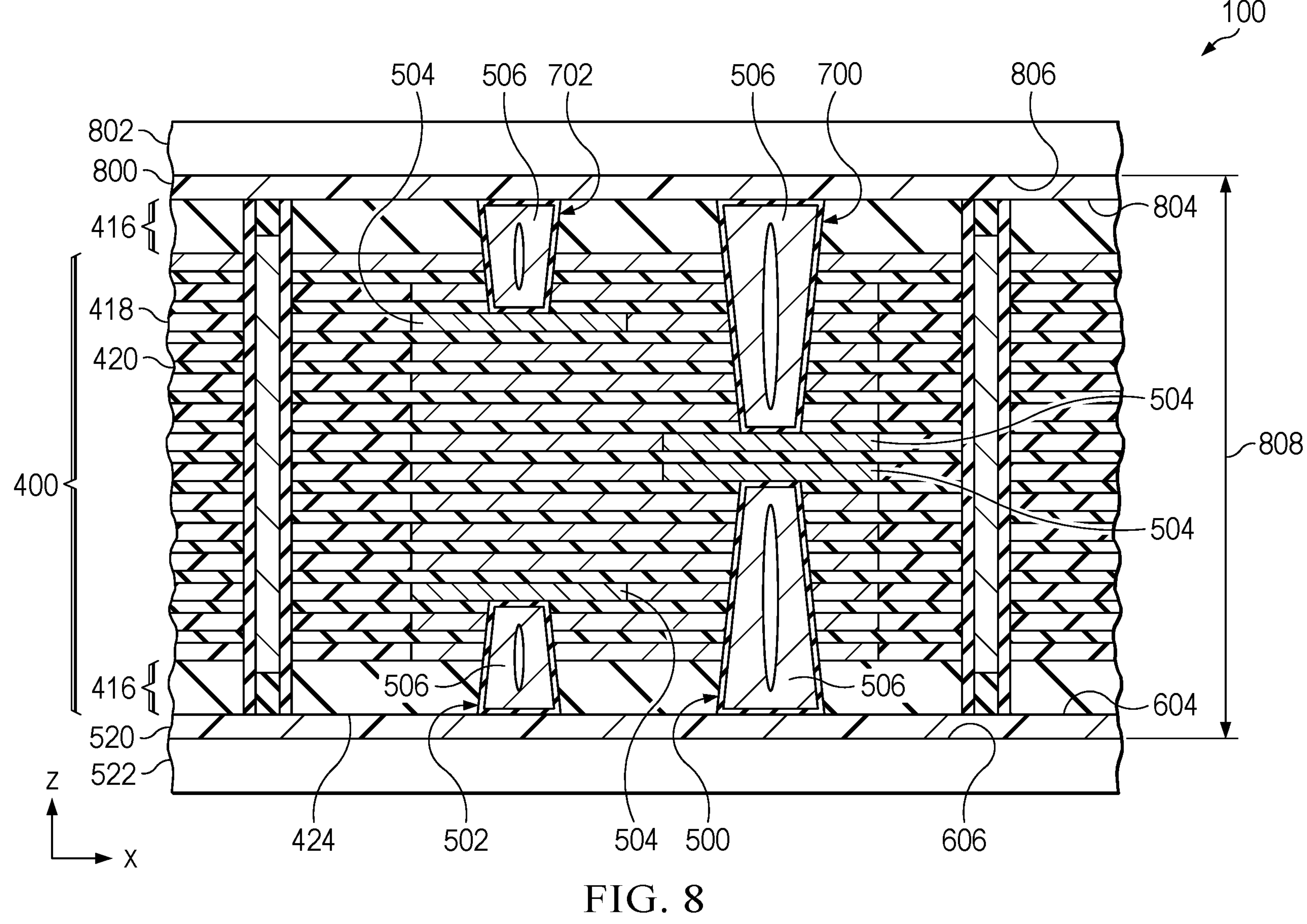

At operation 316, a second semiconductor layer 800 is bonded to the second surface 426 of the stack structure 400. A third substrate 802 is formed over and in contact with the second semiconductor layer 800. FIG. 8 shows the 3D memory device 100, formed from the 3D stack structure 400, having multiple interleaved layers (i.e., first dielectric layers 412 and second dielectric layers 414, first conductive layer 418, and high-k dielectric layer 420) disposed between semiconductor layers 520, 800 surrounded by substrates 402, 802. The first substrate 402 and third substrate 802 form a housing 808, in some examples.

The second semiconductor layer 800 has a first surface 804 and a second surface 806, opposite the first surface 604. The first and second substrate 402, 802 can be any suitable semiconductor material, such as silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof.

Figure 9:
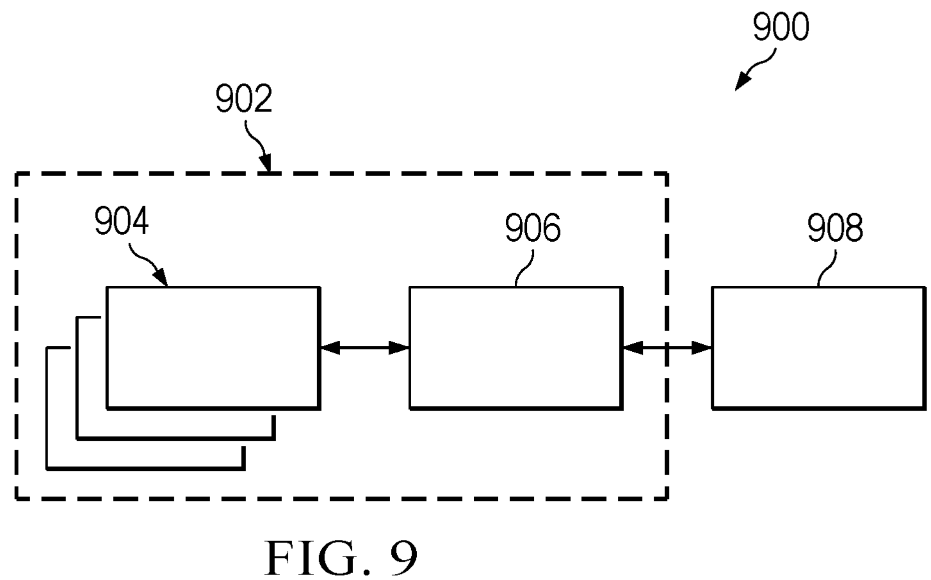
FIG. 9 illustrates a block diagram of a system having a 3D memory device.

FIG. 9 illustrates a block diagram of system 900 having a 3D memory device, according to some aspects of the present disclosure. The system 900 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 9, the system 900 can include a host 908 and a memory system 902, having one or more 3D memory devices 904 and a memory controller 906. Host 908 can be a processor of an electronic device, such as a central processing unit (CPU), or a system-on-chip (SoC), such as an application processor (AP). Host 908 can be configured to send or receive data to or from 3D memory devices 904.

3D memory device 904 can be any 3D memory device disclosed herein, such as 3D memory device 100 depicted in FIGS. 1-5, 6A, and 6B. In some implementations, each 3D memory device 904 includes a NAND flash memory. Consistent with the scope of the present disclosure, contact structures can replace the contact areas and word line contacts to achieve word line pick-up/fan-out functions, thereby reducing the manufacturing cost and simplifying the fabrication process.

Memory controller 906 (a.k.a., a controller circuit) is coupled to 3D memory device 904 and host 908 and is configured to control 3D memory device 904, according to some implementations. For example, memory controller 906 may be configured to operate multiple channel structures via the word lines. Memory controller 906 can manage the data stored in 3D memory device 904 and communicate with host 908. In some implementations, memory controller 906 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 906 is designed for operating in a high duty cycle environment SSDs or embedded multi-media-cards (eMMCs) used as data storage for mobile devices, such as smartphones, tablets, laptop computers, etc., and enterprise storage arrays. Memory controller 906 can be configured to control operations of 3D memory device 904, such as read, erase, and program operations. Memory controller 906 can also be configured to manage various functions with respect to the data stored or to be stored in 3D memory device 904 including, but not limited to bad-block management, garbage collection, logical-to-physical address conversion, wear leveling, etc. In some implementations, memory controller 906 is further configured to process error correction codes (ECCs) with respect to the data read from or written to 3D memory device 904. Any other suitable functions may be performed by memory controller 906 as well, for example, formatting 3D memory device 904.

Memory controller 906 can communicate with an external device (e.g., host 908) according to a particular communication protocol. For example, memory controller 906 may communicate with the external device through at least one of various interface protocols, such as a USB protocol, an MMC protocol, a peripheral component interconnection (PCI) protocol, a PCIexpress (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 906 and one or more 3D memory devices 904 can be integrated into various types of storage devices, for example, be included in the same package, such as a universal Flash storage (UFS) package or an eMMC package. That is, memory system 902 can be implemented and packaged into different types of end electronic products. In one example, memory controller 906 and a single 3D memory device 904 may be integrated into a memory card (not shown). The memory card can be a PC card, (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. The memory card may include a memory card connector that electrically couples the memory card with the host 908.

For example, in one aspect, a method includes providing a stack structure including alternating first layers and dielectric layers, wherein the stack structure has a first surface and a second surface opposite to the first surface. The method includes forming first contact structures penetrating from the first surface into the stack structure to be in contact respectively with a first portion of the first layers. Additionally, the method includes forming second contact structures penetrating from the second surface into the stack structure to be in contact respectively with a remainder portion of the first layers other than the first portion of the first layers.

In another example, the memory controller 906 and multiple 3D memory devices 904 may be integrated into a solid-state device (SSD) (not shown). The SSD may include an SSD connector electrically coupling the SSD with the host 908. In some implementations, the storage capacity and/or the operation speed of SSD is greater than those of memory card.

In some implementations of the method, the stack structure has a core area and a contact area adjacent to the core area, and wherein the first contact structures and the second contact structures are in the contact area.

In some implementations of the method, forming the first contact structures includes forming first vertical recesses penetrating from the first surface into the contact area to be in contact respectively with the first portion of the first layers. The method additionally includes depositing a dielectric layer in each of the first vertical recesses. The method includes punching (i.e., making an opening by a process such as etching) through the dielectric layer to form first lateral recesses connected respectively with the first vertical recesses. Each of the first lateral recesses extends in a respective one of the first portion of the first layers. Additionally, the method includes filling the first vertical recesses and the first lateral recesses with conductive material. Forming the second contact structures includes forming second vertical recesses penetrating from the second surface into the contact area to be in contact respectively with a remainder of the first layers other than the first portion of the first layers. In addition, the method includes depositing a dielectric layer in each of the second vertical recesses. The method further includes punching through the dielectric layer to form second lateral recesses connected respectively with the second vertical recesses, wherein each of the second lateral recesses extends in a respective one of the remainder portion of the first layers. The method includes filling the second vertical recesses and second first lateral recesses with the conductive material.

In some implementations, the method includes etching the first layers in the core area to create recesses. The method additionally includes forming second layers by filling the recesses in the core area with conductive material to be in contact respectively with the first contact structures and the second contact structures.

In some implementations, the first layers are sacrificial layers and the second layers are conductive layers.

In some implementations, the method includes electrically connecting first peripheral circuit to the first contact structures and second peripheral circuit to the second contact structures.

In some implementations, the method includes, removing a substrate of the stack structure after electrically connecting the first peripheral circuit to the first contact structures.

In some implementations, after removing the substrate, the method includes forming a protective layer outside of the second surface before forming the second contact structures.

In another aspect, the present disclosure describes a memory device includes a stack structure having alternating first layers and dielectric layers. The stack structure has a first surface and a second surface opposite to the first surface. The memory device includes first contact structures have a conductive material. The first contact structures penetrate from the first surface into the stack structure to be in contact respectively with a first portion of first layers. The memory device also includes second contact structures have a conductive material, wherein each of the second contact structures penetrates from the second surface into the stack structure to be in contact respectively with a remainder portion of conductive layers other than the first portion of the first layers.

In some implementations, the stack structure has a core area and a contact area adjacent to the core area, the first layers in the core area are conductive layers, and the first layers in the contact area are sacrificial layers.

In some implementations, each of the first contact structures and the second contact structures has a vertical contact and a lateral contact connecting to the vertical contact.

In some implementations, the vertical contact of each of the first contact structures penetrates from the first surface into the contact area to connect with a respective lateral contact. The vertical contact of each of the second contact structures penetrates from the second surface into the contact area to connect with a respective lateral contact.

In some implementations, the vertical contact of each of the first contact structures and the second contact structures is at least partially circumscribed by a dielectric layer.

In some implementations, the lateral contact of each of the first contact structures and the second contact structures extends in a respective one of the sacrificial layers in the contact area and electrically connects to a respective one of the conductive layers in the core area.

In some implementations, a vertical contact connecting to lateral contact at a deeper depth from the first surface or the second surface has a larger cross-sectional area at the respective first surface or the second surface.

In some implementations, a cross-sectional area of a vertical contact of a first contact structure at the first surface overlaps at least partially with a cross-sectional area of a vertical contact of a respective second contact structure at the second surface.

In some implementations, the memory device has first peripheral circuits electrically connected to the first contact structures and second peripheral circuits electronically connected to the second contact structures.

In some implementations, the first peripheral circuits and the second peripheral circuits are located on opposite sides of the stack structure.

In some implementations, the memory device includes a first substrate bonded to the first surface and a second substrate bonded to the second surface, and wherein the first substrate and the second substrate include silicon.

In another aspect, the present disclosure also describes a system that includes a memory device configured to store data. The memory device includes a stack structure has alternating first layers and dielectric layers. The stack structure has a first surface and a second surface opposite to the first surface. The memory devices includes first contact structures that have a conductive material. Each of the first contact structures penetrates from the first surface into the stack structure to be in contact respectively with a first portion of first layers. Second contact structures of the memory device have a conductive material. Each of the second contact structures penetrates from the second surface into the stack structure to be in contact respectively with a remainder portion of conductive layers other than the first portion of the first layers. A memory controller electrically connects to and controls the memory device.

While this specification contains many specific implementation details, these should not be construed as limitations on the scope of what is being claimed, which is defined by the claims themselves, but rather as descriptions of features that may be specific to particular implementations of particular the disclosure. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claim may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing of the disclosed operations may be advantageous.

Accordingly, the foregoing description of the specific implementations can be readily modified and/or adapted for various applications. Therefore, such adaptations and modifications are intended to be within the meaning and range of equivalents of the disclosed implementations, based on the teaching and guidance presented herein. The breadth and scope of the present disclosure should not be limited by any of the above-described example of the disclosed implementations, but should be defined only in accordance with the following claims and their equivalents. Other implementations also are within the scope of the following claims.

What is claimed is:

1. A method of forming a memory device, comprising:

providing a stack structure comprising vertically arranged alternating first layers and dielectric layers, wherein the stack structure has a first surface and a second surface opposite to the first surface;

forming first contact structures penetrating vertically from the first surface into the stack structure to be in contact respectively with a first portion of the first layers; and forming second contact structures penetrating vertically from the second surface into the stack structure to be in contact respectively with a remainder portion of the first layers other than the first portion of the first layers, wherein the first contact structures are vertically spaced apart from the respective second contract structures.

2. The method of claim 1, wherein the stack structure comprises a core area and a contact area adjacent to the core area, and wherein the first contact structures and the second contact structures are in the contact area.

3. The method of claim 2, wherein forming the first contact structures comprises:

forming first vertical recesses penetrating from the first surface into the contact area to be in contact respectively with the first portion of the first layers;

depositing a dielectric layer in each of the first vertical recesses;

punching through the dielectric layer to form first lateral recesses connected respectively with the first vertical recesses, wherein each of the first lateral recesses extends in a respective one of the first portion of the first layers; and filling the first vertical recesses and the first lateral recesses with conductive material; and wherein forming the second contact structures comprises:

forming second vertical recesses penetrating from the second surface into the contact area to be in contact respectively with a remainder of the first layers other than the first portion of the first layers;

depositing a dielectric layer in each of the second vertical recesses;

punching through the dielectric layer to form second lateral recesses connected respectively with the second vertical recesses, wherein each of the second lateral recesses extends in a respective one of the remainder portion of the first layers; and filling the second vertical recesses and second first lateral recesses with the conductive material.

4. The method of claim 2, further comprising:

etching the first layers in the core area to create recesses; and forming second layers by filling the recesses in the core area with conductive material to be in contact respectively with the first contact structures and the second contact structures.

5. The method of claim 4, wherein the first layers are sacrificial layers and the second layers are conductive layers.

6. The method of claim 1, further comprising:

electrically connecting first peripheral circuit to the first contact structures and second peripheral circuit to the second contact structures.

7. The method of claim 6, further comprising:

removing a substrate of the stack structure after electrically connecting the first peripheral circuit to the first contact structures.

8. The method of claim 7, further comprising:

after removing the substrate, forming a protective layer outside of the second surface before forming the second contact structures.

9. A memory device, comprising:

a stack structure comprising alternating first layers and dielectric layers that are vertically arranged, wherein the stack structure has a first surface and a second surface opposite to the first surface;

first contact structures comprising conductive material, wherein the first contact structures penetrate vertically from the first surface into the stack structure to be in contact respectively with a first portion of first layers; and second contact structures comprising conductive material, wherein each of the second contact structures penetrates vertically from the second surface into the stack structure to be in contact respectively with a remainder portion of conductive layers other than the first portion of the first layers, wherein the first contact structures are vertically spaced apart from the respective second contract structures.

10. The memory device of claim 9, wherein the stack structure comprises a core area and a contact area adjacent to the core area, wherein the first layers in the core area are conductive layers, and wherein the first layers in the contact area are sacrificial layers.

11. The memory device of claim 10, wherein the vertical contact of each of the first contact structures penetrates from the first surface into the contact area to connect with a respective lateral contact, and wherein the vertical contact of each of the second contact structures penetrates from the second surface into the contact area to connect with a respective lateral contact.

12. The memory device of claim 10, wherein the lateral contact of each of the first contact structures and the second contact structures extends in a respective one of the sacrificial layers in the contact area and electrically connects to a respective one of the conductive layers in the core area.

13. The memory device of claim 9, wherein each of the first contact structures and the second contact structures comprises a vertical contact and a lateral contact connecting to the vertical contact.

14. The memory device of claim 13, wherein the vertical contact of each of the first contact structures and the second contact structures is at least partially circumscribed by a dielectric layer.

15. The memory device of claim 13, wherein a vertical contact connecting to lateral contact at a deeper depth from the first surface or the second surface has a larger cross-sectional area at the respective first surface or the second surface.

16. The memory device of claim 13, wherein a cross-sectional area of a vertical contact of a first contact structure at the first surface overlaps at least partially with a cross-sectional area of a vertical contact of a respective second contact structure at the second surface.

17. The memory device of claim 9, wherein the memory device further comprises first peripheral circuits electrically connected to the first contact structures and second peripheral circuits electronically connected to the second contact structures.

18. The memory device of claim 17, wherein the first peripheral circuits and the second peripheral circuits are located on opposite sides of the stack structure.

19. The memory device of claim 9, wherein memory device further comprises a first substrate bonded to the first surface and a second substrate bonded to the second surface, and wherein the first substrate and the second substrate comprise silicon.

20. A system, comprising:

a memory device configured to store data, the memory device comprising:

a stack structure comprising alternating first layers and dielectric layers that are vertically arranged, wherein the stack structure has a first surface and a second surface opposite to the first surface;

first contact structures comprising conductive material, wherein each of the first contact structures penetrates vertically from the first surface into the stack structure to be in contact respectively with a first portion of first layers; and second contact structures comprising conductive material, wherein each of the second contact structures penetrates vertically from the second surface into the stack structure to be in contact respectively with a remainder portion of conductive layers other than the first portion of the first layers, wherein the first contact structures are vertically spaced apart from the respective second contract structures; and a memory controller that electrically connects to and controls the memory device.

* * * * *